United States Patent

Pierpaoli et al.

Patent Number: 5,969,524
Date of Patent: Oct. 19, 1999

[54] METHOD TO SIGNIFICANTLY REDUCE BIAS AND VARIANCE OF DIFFUSION ANISOTROPHY MEASUREMENTS

[75] Inventors: Carlo M. Pierpaoli, Rockville, Md.; Peter J. Basser, Washington, D.C.

[73] Assignee: The United States of America as represented by the Department of Health and Human Services, Washington, D.C.

[21] Appl. No.: 08/824,706

[22] Filed: Apr. 14, 1997

[51] Int. Cl.⁶ .................................................. G01V 3/00
[52] U.S. Cl. .......................... 324/307; 324/309; 382/128
[58] Field of Search ................................... 382/280, 128, 382/132; 324/307, 309; 600/342, 475

[56] References Cited

U.S. PATENT DOCUMENTS

| | | | |
|---|---|---|---|
| Re. 33,391 | 10/1990 | Breton et al. | 324/309 |
| 4,716,367 | 12/1987 | Patz | 324/309 |
| 4,752,734 | 6/1988 | Wedeen | 324/306 |
| 5,187,658 | 2/1993 | Cline et al. | 382/128 |
| 5,452,723 | 9/1995 | Wu et al. | 600/342 |
| 5,488,297 | 1/1996 | Nakada | 324/309 |
| 5,492,123 | 2/1996 | Edelman | 600/410 |
| 5,539,310 | 7/1996 | Basser et al. | 324/307 |
| 5,560,360 | 10/1996 | Filler et al. | 128/653.2 |
| 5,630,423 | 5/1997 | Wang et al. | 600/475 |
| 5,786,692 | 7/1998 | Maier et al. | 324/307 |

FOREIGN PATENT DOCUMENTS

| | | | |
|---|---|---|---|
| WO 95/04940 | 2/1995 | WIPO | 324/309 |

OTHER PUBLICATIONS

Sakuma, H. et al., "Adult and Neonatal Human Brian: Diffusional Anisotropy and Myelination with Diffusion-weighted MR Imaging", Radiology, vol. 180, pp. 229–233 (1991).

LeBihan, D. et al., "Is Water Diffusion Restricted in Human Brain White Matter", Neuroreport, vol. 4, pp. 887–890 (1993).

Nomura, Y., et al., "Diffusional Anisotropy of the Human Brain Assessed with Diffusion–Weighted MR: Relation with Normal Brain Development and Aging", AJNR Am J Neuroradiol, vol. 15, pp. 231–238 (1994).

Brunberg, J.A., et al. "In vivo MR Determination of Water Diffusion Coefficients and Diffusion Anisotropy: Correlation with Structural Alteration in Gliomas of the Cerebral Hemispheres", AJNR Am J Neuroradiol, vol. 16, pp. 361–371 (1995).

(List continued on next page.)

*Primary Examiner*—Leo H. Boudreau
*Assistant Examiner*—Gregory Desire
*Attorney, Agent, or Firm*—Morgan & Finnegan, LLP

[57] ABSTRACT

A method for quantitatively assessing diffusion anisotropy according to an invariant anisotropy index that accounts for orientational coherence of the measured principal directions between different localized regions of an object to counteract the bias and increased variance effects of noise inherent in the diffusion measurement. A diffusion weighted imaging sequence is performed on a two-dimensional slice of an object to provide raw diffusion weighted image signals, which are processed by conventional Fourier transform and magnitude reconstruction to provide diffusion weighted images, from which a diffusion tensor is estimated for each voxel of the imaged slice. In each voxel a lattice anisotropy index is calculated as a function of both the eigenvalues and eigenvectors of neighboring voxels such that intervoxel orientational coherence compensates noise-induced bias effects. The orientational coherence measure between two voxels is calculated according to an intervoxel deviatoric tensor dot product. The intervoxel lattice index for a given voxel is locally averaged over a group of adjacent voxel to provide a resulting lattice index for the given voxel. Lattice index images for visual observation of diffusion anisotropy are generated according to the lattice index in each voxel. Monte Carlo simulations are used to assess the noise immunity of lattice index functions formulated according to the present invention.

26 Claims, 5 Drawing Sheets

OTHER PUBLICATIONS

Basser, Peter J., "Inferring Microstructural Features and the Physiological State of Tissues from Diffusion–Weighted Images", NMR in Biomedicine, vol. 8, pp. 333–344 (1995).

Basser, Peter J. and Pierpaoli, Carlo, "Microstructural and Physiological Features of Tissue Elucidated by Quantitive–Diffusion–Tensor MRI", Journal of Magnetic Resonance Series B vol. 111, pp. 209–219 (Feb. 1996).

Pierpaoli, C. et al., "Identification of Fiber Degeneration and Organized Glicosis in Stroke Patients by Diffusion Tensor MRI", Proceedings of ISMRM, vol. 2, p. 563 (Apr. 1996).

Pierpaoli, C. et al., "New Invariant "Lattice" Index Achieves Significant Noise Reduction in Measuring Diffusion Anisotropy", Proceedings of the ISMRM, vol. 2, p. 1326 (Apr. 1996).

Pierpaoli, C. et al., "Toward a Quantitative Assessment of Diffusion Anisotropy", Magnetic Resonance in Medicine, vol. 36, pp. 893–906 (Dec. 1996).

Basser, Peter J., "Quantifying Errors in Fiber–Tract Direction and Diffusion Tensor Field Maps Resulting From MR Noise", International Society for Magnetic Resonance in Medicine, Fifth Scientific Meeting, Vancouver, B.C., Canda, Apr. 12–18, 1997.

Basser, Peter J., "Elucidating Tissue Structure by Diffusion Tensor MRI", Proceedings of the Society of Magnetic Resonance, Third Scientific Meeting and Exhibition and The European Society for Magnetic Resonance In Medicine and Biology, Twelfth Annual Meeting and Exhibition, held in Nice, France, Aug. 19–25, 1995, vol. 2, p. 900.

Pierpaoli, Carlo, et al., "Diffusion Tensor MR Imaging of the Human Brain", Radiology, 1996, vol. 201; pp. 637–648.

Ulug, Aziz M. et al., Mapping of Human Brain Fibers Using Diffusion Tensor Imaging, Proceedings of the International Society for Magnetic Resonance in Medicine, Fourth Scientic Meeting and Exhibition, New York, NY, Apr. 27–May 3, 1996, vol. 2, p. 1325.

METHOD TO SIGNIFICANTLY REDUCE BIAS AND VARIANCE OF DIFFUSION ANISOTROPHY MEASUREMENTS

TECHNICAL FIELD

The present invention relates generally to imaging, specifically to diffusion-weighted magnetic resonance imaging, and more particularly to a quantitative and statistically robust method for measuring anisotropic diffusion in an object.

BACKGROUND OF THE INVENTION

MR measurements of water diffusion in organs and tissues having an orderly, oriented structure, such as skeletal, cardiac, and uterine muscle, portions of the kidney, the lens, and white matter, exhibit diffusion anisotropy (i.e., a dependence of the diffusively on direction). The development of quantitative MRI measures of diffusion anisotropy is deemed to have important biological and clinical applications, helping clinicians infer microstructural characteristics of normal tissues that are undetected using other techniques, as well as pathological changes in tissue microstructure. This microstructural information may be useful in arriving at a correct diagnosis, as well as choosing and implementing appropriate therapies.

However, while a qualitative indication of diffusion anisotropy can be obtained by inspecting diffusion weighted images (DWIs), a quantitative assessment is more problematic. On theoretical grounds, it has been predicted that currently used indices of diffusion anisotropy derived from DWIs or from two or three apparent diffusion coefficients (ADCs) measured in perpendicular directions are not quantitative. In particular, they are rotationally variant because their values depend upon the direction of the applied diffusion gradients and the orientation of structures within each voxel. See, e.g., P. J. Basser, J. Mattiello, D. LeBihan. "MR diffusion tensor spectroscopy and imaging", *Biophys J* 66, 259–267 (1994), which is herein incorporated by reference. Further, it has been experimentally observed in living monkey brain that these indices which are calculated directly from ADCs generally underestimate the degree of diffusion anisotropy, and that this orientational artifact can be so severe as to make some highly anisotropic white matter structures appear completely isotropic, indistinguishable from gray matter. See, Pierpaoli, Carlo, and Basser, Peter J., "Toward a Quantitative Assessment of Diffusion Anisotropy", *Magnetic Resonance in Medicine*, vol. 36, pp. 893–906 (December 1996).

This orientational artifact can be eliminated by using rotationally invariant anisotropy indices that are functions of the eigenvalues of the diffusion tensor. These rotationally invariant anisotropy measures have values that are independent of the laboratory frame of reference, the direction of the applied diffusion gradients, and the orientation of the tissue structures within each voxel. Some of these rotationally invariant anisotropy measures require that the eigenvalues be sorted in magnitude order, while others do not require such sorting.

Nevertheless, even though these rotationally invariant indices elucidate anisotropy independent of orientational artifacts, these indices are still susceptible to noise inherent in the DWIs. Specifically, it has been demonstrated by Monte Carlo simulations that measurement noise introduces a bias in rotationally invariant diffusion anisotropy measures such that isotropic structures appear anisotropic and anisotropic structures appear more anisotropic. See, Pierpaoli, Carlo, and Basser, Peter J., "Toward a Quantitative Assessment of Diffusion Anisotropy", *Magnetic Resonance in Medicine*, vol. 36, pp. 893–906 (December 1996).

Further, due to the noise-induced bias in the measured eigenvalues, rotationally invariant anisotropy measures that require the eigenvalues to be sorted by their magnitude (such as the ratio of the largest and smallest eigenvalues, $\lambda_1/\lambda_3$) are susceptible to a sorting bias that systematically overestimates of the degree of diffusion anisotropy. Moreover, once the eigenvalues (and/or eigenvectors) are sorted, the assumptions of random sampling are violated so that standard statistical tests used to analyze their distributions no longer apply.

In inhomogeneous tissues, attempts to increase SNR, either by increasing voxel size or by averaging the signal intensity of DWIs (or diffusion tensors, or rotationally invariant indices) over a region of interest, introduce a partial volume artifact that causes one to underestimate diffusion anisotropy by averaging a nonuniform distribution of fiber-tract directions. Therefore, such averaging techniques cannot be applied generally to mitigate noise and bias in the anisotropy indices.

It is further noted that the diffusion tensor may be used to construct diffusion ellipsoid images to elucidate anisotropy. The diffusion ellipsoids are surfaces of constant mean-squared displacement of diffusing water molecules at some time $\tau$ after they are released at the center of each voxel. The diffusion ellipsoids summarize the information contained in the diffusion tensor. The degree of diffusion anisotropy is embodied in the shape or eccentricity of the diffusion ellipsoid; the bulk mobility of the diffusing species is related to the size of the diffusion ellipsoid; and the preferred directions of diffusion are indicated by the orientation of the diffusion ellipsoid. If the tissue were isotropic, then the water mobility would be the same in all directions, and these surfaces would be spherical. However, if the medium were anisotropic, like brain white matter, then the mobility would depend upon the direction in which it is measured, and these surfaces would be ellipsoidal. Although the diffusion ellipsoids embody the information contained in the diffusion tensor, they are subject to the same artifacts that affect other rotationally invariant anisotropy measures.

Thus, it may be understood that anisotropy measures are susceptible and sensitive to background noise inherent in all DWIs. This effect influences the mean and variance of all diffusion anisotropy measures estimated from DWIs, and thus their accuracy and precision.

There remains a need, therefore, for further improvements in quantitatively assessing diffusion anisotropy, and particularly, a need for an anisotropy measure or index which is not only rotationally invariant but also is immune to noise.

SUMMARY OF THE INVENTION

It is, therefore, an object of the present invention to improve noise immunity of anisotropy indices.

Another object of the present invention is to mitigate the effects of noise on rotationally invariant anisotropy indices.

A further object of the present invention is to provide an anisotropy index which has reduced bias and variance due to noise in DWIs, compared to previous measures.

Yet another object of the present invention is to provide for a family of rotationally invariant anisotropy indices that are relatively insensitive to variations in signal-to-noise ratio in the DWIs.

Yet a further object of the present invention is to provide anisotropy images which are based on a rotationally invariant anisotropy index that is insensitive to noise variations in DWIs.

It is still a further object of the present invention to provide a diffusion anisotropy index which simultaneously satisfies the following conditions:

(a) It is rotationally invariant, i.e. its value is independent of the direction of the laboratory frame of reference in which the diffusion measurement is performed and is independent of the orientation of the anisotropic structures within the object.

(b) It is quantitative, i.e. it is formulated so that its values are specifically related to features of the diffusion process and are not influenced by other parameters such as T1 and T2 relaxation times.

(c) It is noise immune, i.e. its values are less biased and have a lower variance than other anisotropy measures obtained from the same set of diffusion measurements.

Still another object of the present invention is improving the estimate of a diffusion tensor's eigenvalues and eigenvectors, or functions thereof, based on local (e.g., intervoxel) fiber direction field coherence or order in anisotropic media.

The present invention achieves these and other objects, and overcomes limitations of the background art and the prior art, by providing a method for quantitatively assessing diffusion anisotropy according a diffusion anisotropy measure which is influenced by the degree of orientational coherence between the measured principal directions of diffusion in each voxel and the measured principal directions of diffusion in neighbor voxels. In accordance with an embodiment of the invention, a diffusion weighted magnetic resonance imaging sequence is performed on an object to provide raw diffusion weighted signals, which are processed by conventional Fourier transform magnitude reconstruction techniques to provide diffusion weighted images, from which a diffusion tensor is estimated for each voxel of the imaged object. For each voxel, a lattice anisotropy measure is calculated as a function of both the eigenvalues and eigenvectors of neighboring voxels such that intervoxel orientational coherence of the eigenvectors compensates for noise-induced bias effects. The orientational coherence measure between two voxels is calculated according to the intervoxel deviatoric tensor dot product, resulting in weighting of the product of corresponding eigenvalues in the different voxels by the coherence of the eigenvectors along the correponding directions. The intervoxel lattice index for a given voxel is locally averaged over a group of adjacent voxels. Lattice index images for visual observation of diffusion anisotropy are generated according to the lattice index in each voxel.

In accordance with a further embodiment of the present invention, local averaging is only performed with adjacent voxels having corresponding histological, physical, or physiological parameters such as T1, T2, or trace of the diffusion tensor. Preferably, Monte Carlo simulations are used to assess the noise immunity of lattice index functions formulated according to the present invention.

BRIEF DESCRIPTION OF THE DRAWINGS

Additional aspects, features, objects, and advantages of the invention will be understood and will become more readily apparent when the invention is considered in the light of the following description made in conjunction with the accompanying drawings, wherein.

DETAILED DESCRIPTION OF THE PREFERRED EMBODIMENT

Figure 1:
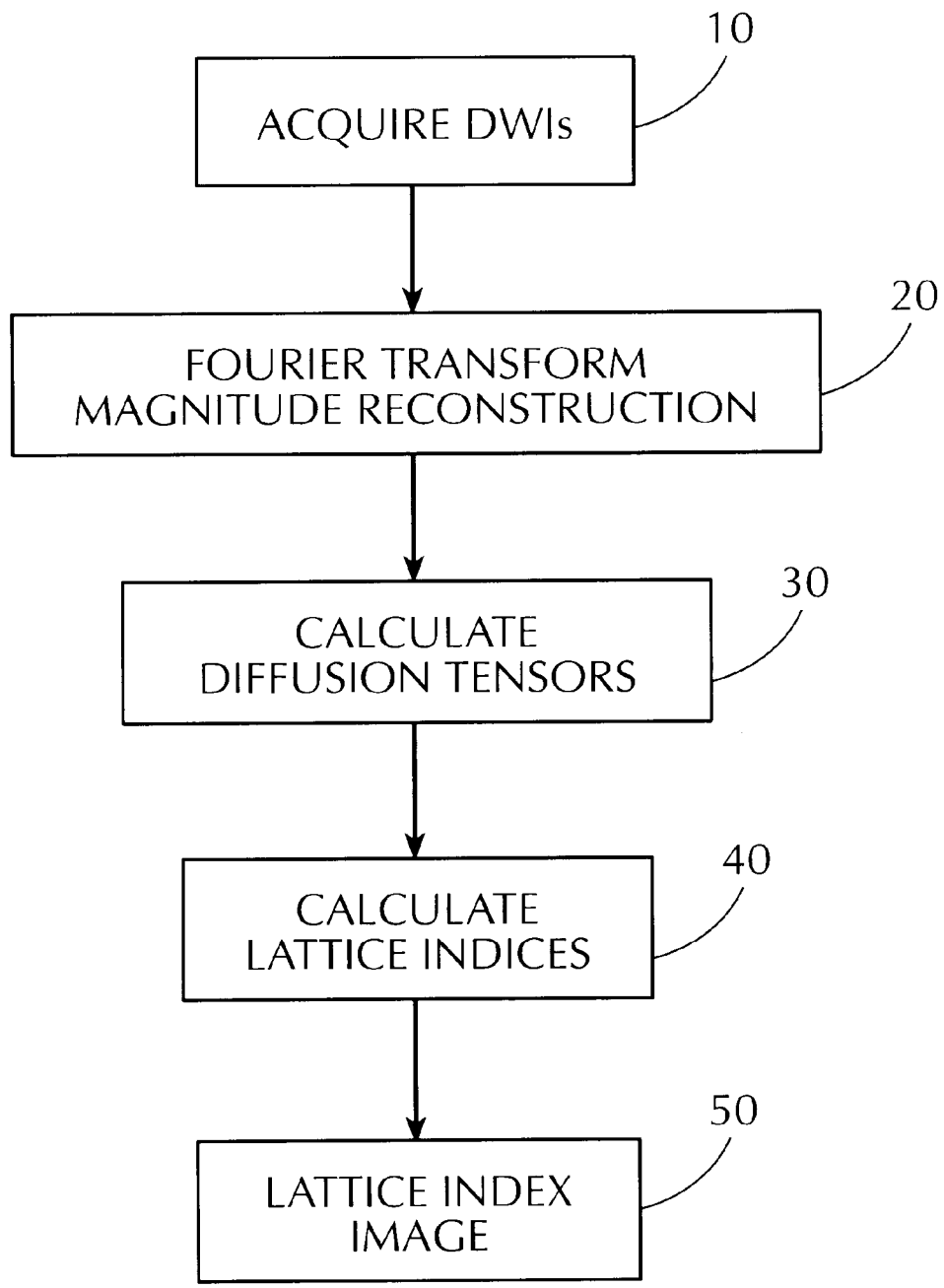
FIG. 1 is a flow diagram illustrating steps including an embodiment of the present invention.

Referring to FIG. 1, there is shown a flow diagram illustrating a MRI data acquisition and processing method incorporating an embodiment of the present invention. In step 10, a diffusion weighted magnetic resonance (MR) imaging acquisition sequence is applied to a region (e.g., two-dimensional slice or three-dimensional volume) of an object under study using a conventional magnetic resonance imaging (MRI) system. The MRI acquisition sequence acquires raw diffusion weighted images (DWIs) sufficient for determining the diffusion tensor (or equivalently, the eigenvalues and the eigenvectors of the diffusion tensor) in each localized region of the imaged region. In step 20, conventional Fourier transform and magnitude reconstruction processing is applied to the raw MRI data, thereby providing DWIs wherein each DWI includes a diffusion weighted intensity signal for each localized region (voxel) of the imaged object region. Next, in accordance with an embodiment of the present invention, in step 30 the diffusion tensor for each voxel is determined. Then, in step 40, a lattice anisotropy index which accounts for intervoxel orientational coherence such that it is insensitive to noise induced bias and variance effects, in accordance with the present invention, is calculated for each voxel from the diffusion tensor. In step 50, the anisotropy information present in the lattice anisotropy indices is then presented as a lattice anisotropy image.

It is understood that the DWI acquisition (step 10) is under programmatic control of a computing system contained within the MRI system, and that subsequent data processing involved in steps 20–50, may be performed "on-line", by the computer which also controls and executes DWI acquisition, or "off-line", by a computing system separate from the MRI scanner. For instance, Fourier magnitude reconstruction (step 20) may be performed by the MRI system on-line computer, and the resulting DWIs may then be transferred to a separate computing system, such as a SUN Sparc-10 workstation executing software written in IDL (Iterative Data Language), for analysis and processing to generate lattice anisotropy indices and images.

A preferred DWI processing technique embodying step 30 is disclosed in commonly assigned U.S. Pat. No. 5,539,310, which issued on Jul. 23, 1996, and which is herein incorporated by reference. According to this methodology, for each voxel for each DWI an effective diffusion tensor, D, is determined using a general relationship between the measured echo magnitude, A(b), in each voxel and all the imaging and diffusion gradient waveforms of the MRI sequence used for acquiring the DWI, wherein the relationship may be represented as:

$$\text{Ln}\left(\frac{A(b)}{A(b=0)}\right) = -\sum_{i=1}^{3}\sum_{j=1}^{3} b_{ij} D_{ij} \tag{1}$$

where $D_{ij}$ represents the diffusion tensor elements, b represents the b-matrix, A(b=0) represents the signal intensity with no diffusion sensitization, and $b_{ij}$ represents elements of the b-matrix which accounts for interactions among: diffusion gradient pulses; diffusion and imaging gradient pulses; and imaging gradient pulses, which may be applied along the same direction or along different directions. For each image, the b-matrix elements may be calculated by, for example, numerical integration. Alternatively, it may be possible to derive analytical expressions for the b-matrix from the imaging and gradient waveforms in order to facilitate calculation of the b-matrix, such as previously described for various commonly used MRI sequences. See, for example, J. Mattiello, P. J. Basser, D. LeBihan, "Analytical expression for the b matrix in NMR diffusion imaging and spectroscopy", *Journal of Magnetic Resonance* A 108, 131–141 (1994); P. J. Basser, J. Mattiello, D. LeBihan, "Estimation of the effective self-diffusion tensor from the NMR spin echo", *J Magn Reson B* 103, 247–254 (1994); and Matiello, J., Basser, P. J. and LeBihan D., "Analytic Expressions for the b-matrix in Diffusion Tensor Echo-Planar Imaging", *Magn. Reson. Med.*, 37, 292–300 (1995), which are herein incorporated by reference.

Although in theory the six independent components (i.e., independent components Dxx, Dyy, Dzz, Dxy, Dxz, and Dyz) of the symmetric diffusion tensor, and the signal intensity with no diffusion sensitization A(b=0) may be calculated from seven independent DWIs, due to noise in the measured MR signal it is preferable to acquire numerous high-resolution DWIs, with a large range of b-matrix values, to provide an overdetermined system of equations which is solved by multivariate regression to yield a statistical estimate of the diffusion tensor in each voxel.

Preferably, the multivariate regression routine accounts for background noise levels present during DTI acquisition. For example, the background noise levels, which may be used to estimate the experimental error variances in the linear regression routine, may be obtained by measuring the root-mean-squared (r.m.s.) signal intensity in regions of the images containing no object (e.g., regions containing no tissue). The weighting factor of the linear regression algorithm may then be set to be the square of the r.m.s. background noise in each image divided by the square of the signal intensity in each voxel. This illustrative procedure corrects for the bias in the experimental variance introduced by taking the logarithm of the measured amplitude signal. This illustrative method, however, does not correct for the distortion produced by taking the logarithm of the rectified noise when the signal is very low.

It is understood, therefore, that diffusion measurements, and concomitantly the rotationally invariant anisotropy indices calculated from the diffusion tensor, are susceptible to the measurement noise. This measurement noise not only increases the variance of the anisotropy measure as the SNR decreases, but also has been shown by numerical simulation to cause a bias in the determined eigenvalues such that resulting anisotropy measures are biased to indicate a greater anisotropy than the actual anisotropy in the media. Bias, as used herein, refers to an offset or deviation of a measured or calculated parameter from its actual value if there were infinite signal-to-noise ratio (SNR). Pierpaoli, C. et al., "Toward a Quantitative Assessment of Diffusion Anisotropy", *Magnetic Resonance in Medicine*, vol. 36, pp. 893–906 (December 1996), which is herein incorporated by reference. It is understood that with noisy diffusion weighted images, the variance may be reduced by locally averaging previously proposed rotationally invariant anisotropy indices over a group of voxels. Yet it is clear that such averaging cannot compensate for noise induced bias in the diffusion tensor information (e.g., eigenvalues) and concomitantly in the anisotropy indices calculated therefrom.

As described, the information embodied in the diffusion tensor may be represented by its eigenvectors and eigenvalues, and may also be conveniently summarized by a diffusion ellipsoid image. The eigenvectors represent the principal, mutually perpendicular directions (orthotropic) along which displacements of the spin-labeled species are uncorrelated, whereas the eigenvalues represent the diffusivities along these preferred directions. Since diffusion anisotropy is intrinsically related to the eigenvalues (i.e., the magnitude of the diffusion along different directions), which determine the shape of the diffusion ellipsoids, not to their eigenvectors (or related Euler angles), which specify their orientation, it is logical that rotationally invariant intravoxel anisotropy indices proposed to date are functions solely of the eigenvalues of D.

In accordance with the present invention, once the diffusion tensor is determined for each voxel, then in step 40 a lattice index is calculated for each voxel from the diffusion tensor information—including the orientation information—such that the measurement noise effects, and particularly the bias, are mitigated or compensated. More specifically, to improve the estimate of diffusion anisotropy in a particular voxel, an anisotropy index is employed which accounts for the degree of orientational coherence of the diffusion ellipsoid (which represents the diffusion tensor) in a reference voxel with those in neighboring voxels such that bias effects due to noise are compensated or mitigated.

In accordance with a preferred embodiment of the present invention, a tensor dot product between the anisotropic parts of the diffusion tensors for different voxels is used as the basis for the definition of a family of possible intervoxel or "lattice" scalar measures of diffusion anisotropy. According to this implementation, the anisotropic part of the diffusion tensor, $\tilde{D}$, referred to as the deviatoric, is defined as (See, Basser, Peter J., and Pierpaoli, Carlo, "Microstructural and Physiological Features of Tissue Elucidated by Quantitative-Diffusion-Tensor MRI", *Journal of Magnetic Resonance*, Series B vol. 111, pp. 209–219, 1996):

$$\tilde{D} = D - <D>I \tag{2}$$

where I is the identity tensor, D is the diffusion tensor, and <D> is a scalar mean diffusively defined as:

$$\langle D \rangle = \frac{Tr(D)}{3} = \frac{D_{xx} + D_{yy} + D_{zz}}{3} = \frac{\lambda_1 + \lambda_2 + \lambda_3}{3} \quad (3)$$

where Tr(D) is the trace of the diffusion tensor, and $\lambda_1$, $\lambda_2$, $\lambda_3$ are the eigenvalues (principal diffusivities) of the diffusion tensor. It is seen that the deviatoric is a measure of the amount that the diffusion tensor deviates from isotropy.

The tensor dot product between anisotropic parts of the diffusion tensor for different voxels may be represented as:

$$\tilde{D} : \tilde{D}' = D : D' - \frac{1}{3} Tr(D) Tr(D') \quad (4)$$

where D:D' is the tensor dot product between the diffusion tensors of two different voxels, which may be shown as being equal to summing the squares of the vector dot product between each pair of semi-major axes, ($\sqrt{\lambda_s}\epsilon_s$ and $\sqrt{\lambda_k'}\epsilon_k'$, as represented by:

$$D : D' = \sum_{k=1}^{3} \sum_{s=1}^{3} \left( \sqrt{\lambda_s}\, \epsilon_s \cdot \sqrt{\lambda_k'}\, \epsilon_k' \right)^2 \quad (5)$$

where $\epsilon_s$ and $\epsilon_k'$ represent indexed eigenvectors of D and D', respectively.

For given values of Tr(D) and Tr(D'), D:D' is maximized when the corresponding eigenvectors of D and D' are collinear (i.e., the diffusion ellipsoids are aligned). It can be seen that this measure of collinearity weights each eigenvector by the corresponding principal diffusively or eigenvalue, and functions to measure the degree of collinearity between the anisotropic parts of the diffusion tensor in different voxels.

The quantity D:D' has been proposed as a measure of structural (diffusive) similarity between media in two different voxels with diffusion tensors D and D'. In addition, the intravoxel tensor dot product of the anisotropic part of the diffusion tensor with itself ($\tilde{D}:\tilde{D}$) has been used as a scalar measure of the magnitude of diffusion anisotropy within a voxel for rotationally invariant anisotropy indices. Further, the intervoxel deviatoric tensor dot product ($\tilde{D}:\tilde{D}'$) has been proposed as a measure of the degree of fiber-tract organization. See, P. Basser, C. Pierpaoli, "Elucidating Tissue Structure by Diffusion Tensor MRI", SMR/ESMRMB, Nice, France, p. 900 (1995); and, Basser, Peter J., and Pierpaoli, Carlo, "Microstructural and Physiological Features of Tissue Elucidated by Quantitative-Diffusion-Tensor MRI", *Journal of Magnetic Resonance*, Series B vol. 111, pp. 209–219 (1996), which are herein incorporated by reference.

It is understood that other functions are possible for measuring the degree of collinearity of the eigenvectors of D in different voxels. For instance, a natural measure is the square of the cosine of the angle between eigenvectors, which is obtained by taking the square of the dot products between two eigenvectors $\epsilon_j$ and $\epsilon_i$.

In accordance with an embodiment of the present invention, an illustrative lattice index based on the intervoxel deviatoric tensor dot product to provide bias immunity, and which also has a particularly good dynamic range for different levels of diffusion anisotropy may be defined as:

$$LI_N = \frac{\sqrt{3}}{\sqrt{8}} \frac{\sqrt{\tilde{D}_{ref} : \tilde{D}_N}}{\sqrt{D_{ref} : D_N}} + \frac{3}{4} \frac{\tilde{D}_{ref} : \tilde{D}_N}{\sqrt{D_{ref} : D_{ref}} \sqrt{D_N : D_N}} \quad (6)$$

where $D_{ref}$ and $\tilde{D}_{ref}$ are the diffusion tensor and its deviatoric in a reference voxel, respectively, and $D_N$ and $\tilde{D}_N$ are the diffusion tensor and its deviatoric in an arbitrary (neighboring) voxel, respectively.

A local intervoxel anisotropy index may be obtained for a given reference voxel by: a) choosing a local region of interest (ROI) in the neighborhood of the reference voxel; b) computing the quantity $LI_N$ relative to the reference voxel for each voxel in the ROI; and c) calculating a weighted average of the $LI_N$ within the ROI. Although there are many ways to compute such an average within each imaged slice, one simple approach is to choose a ROI that includes only the eight voxels that are contiguous to the reference voxel, weighting their contributions according to their distance from the reference voxels:

$$LI_{ref} = \frac{\sum_{N=1}^{8} a_N LI_N}{\sum_{N=1}^{8} a_N} \quad (7)$$

where $LI_{ref}$ is the locally averaged lattice index (the local intervoxel anisotropy index) in the reference voxel, and $a_N$ is a weighting factor whose value is 1 for voxels that share a side with the reference voxel and $1/\sqrt{2}$ for voxels that share only a vertex with the reference voxel. Similarly, where three-dimensional imaging is employed, or multiple contiguous slices are imaged, a simple averaging scheme may be provided by the ROI including all contiguous voxels in three dimensions, with appropriate weighting factors assigned based on distance from the reference voxel. More generally, such an average may be calculated by convolving the lattice index $LI_N$ with an isotropic kernel over a ROI.

In accordance with a further embodiment of the present invention, the local averaging process can be further improved by adapting the local averaging window so that it excludes voxels with substantially different histological, physical, or physiological characteristics from those of the reference voxel (e.g., at a boundary of cerebrospinal fluid (CSF) and white matter in the brain). This local segmentation procedure may employ additional MRI parameters, such as T1 (i.e., spin-lattice relaxation time), T2 (spin-spin relaxation time), Tr(D), etc., which may be extracted from the DWIs themselves (including the DWI where no diffusion gradients are applied), or from separately applied MRI sequences. Alternatively, parameters for histological, physical, or physiological differentiation may be determined from separate diagnostic tools (e.g., Positron Emission Tomography, Computer Axial Tomography, etc.).

A preferred method of representing the lattice anisotropy index, and thus the physical diffusion anisotropy, is by generating a two-dimensional lattice anisotropy image (step 50) in which each pixel (corresponding to a localized region) of the image is assigned an intensity or color value (or other visual characteristic) according to its associated lattice anisotropy index. For example, for each pixel a gray scale level may be assigned based on the lattice anisotropy index value itself or a function thereof. Regions of high or low anisotropy, therefore, may be visually identified in the lattice anisotropy image with confidence even where relatively low signal-to-noise is present, due to the robustness provided by the lattice anisotropy index.

As an intuitive description of the mechanism which renders the lattice index insensitive to noise from a bias and variance standpoint, consider a voxel where the diffusion process is isotropic and where differences in the estimated eigenvalues of D result solely from random noise. This is equivalent to saying that, because of noise, the diffusion process in this voxel appears anisotropic (if the diffusion process is isotropic the three eigenvalues of D must be equal by definition). If many replicate experiments were performed, it may be expected, however, that the principal axes of the corresponding diffusion ellipsoids would be randomly oriented, and that the measured eigenvectors of D in that particular voxel would be uncorrelated. Moreover, the orientation of both the diffusion ellipsoid and the measured eigenvectors of D in one voxel should be uncorrelated with itself and that of its neighbors. By contrast, if the tissue were truly anisotropic, the diffusion ellipsoid in a particular voxel would have a preferred direction, and would be correlated with the orientation of the ellipsoids in adjacent voxels. It may be understood that an underlying assumption is that anisotropic media has diffusion characteristics which are locally homogeneous. More particularly, it is assumed that in anisotropic media the diffusion ellipsoid in a given voxel has similar orientation to the diffusion ellipsoid in nearby voxels, which is inherently coupled to correlation in the underlying local media structural properties (e.g., myelinated fibers). Also consider that as the SNR decreases, the apparent intravoxel anisotropy increases compared to the actual anisotropy. In addition, however, as the SNR decreases, the variance of the apparent intervoxel orientational coherence (e.g., variance in the degree of alignment of the respective diffusion ellipsoids) increases compared to the actual orientational variance, and concomitantly the apparent intervoxel orientational coherence (e.g., magnitude of the coherence measure) decreases on average compared with the actual orientational coherence. Thus, in accordance with the present invention, an anisotropy measure is provided such that the noise-induced apparent increase in intravoxel anisotropy is compensated, offset, or otherwise mitgated by the noise-induced apparent reduction in intervoxel orientational coherence.

It is understood that there are myriad possible alternative implementations of a lattice index which accounts for intervoxel diffusion tensor orientational coherence such that the lattice index exhibits noise immunity (e.g., low bias and variance as the SNR is decreased). For instance, it is possible to take different linear combinations of the two terms shown in equation (6). As another example, a linear combination of respective polynomial expansions of the first term and the square root of the second term is possible. A further example is a polynomial expansion in $(\tilde{D}_{ref}:\tilde{D}_N)_{1/2}$, each term of the polynomial appropriately weighted and normalized. These are only several examples of myriad functions of intervoxel orientational coherence measures that may be used as a lattice index which can exhibit the desired noise immunity.

It is further understood that the intervoxel orientational coherence may be represented by functions of the diffusion tensor other than the tensor dot product, and further, that the orientational coherence measure (function) may be linearly separable from the anisotropy measure (function). For instance, functions of the diffusion tensor Euler angles may also be constructed to provide an intervoxel orientational coherence measure which modulates, compensates, or otherwise mitigates apparent increase in an intravoxel anisotropy measure as the SNR decreases. Similarly, although the above-defined deviatoric is employed to represent the anisotropic part of the diffusion tensor, this anisotropic part may be represented in alternative ways, and further, as described, separate and distinct anisotropy (e.g., dependent only on the eigenvalues) and coherence (e.g., dependent only on the eigenvectors) measures (functions) may be combined linearly or non-linearly to form a lattice anisotropy measure such that it is immune to noise induced bias effects in accordance with the present invention.

An arbitrary function of the intervoxel orientational coherence, however, will not necessarily exhibit low bias and variance, and in accordance with an aspect of the present invention, the noise immunity of such functions may be assessed by Monte Carlo techniques which simulate the propagation of measurement noise into the DWIs and into the variance and bias of the calculated lattice index. Application of Monte Carlo techniques to MRI is well known, and the application to the present invention as method for verifying noise immunity of various anisotropy lattice indices (e.g., anisotropy indices that account for intervoxel orientational coherence of the anisotropic part of the diffusion tensor) may be further understood with reference to the example described hereinbelow. Additional criteria for assessing the lattice index include dynamic range and linearity at different noise levels.

It may also be understood that while the foregoing embodiment of the present invention statistically estimates the diffusion tensor, and then uses the diffusion tensor information to calculate the lattice index (e.g., either directly from the diffusion tensor, or from the eigenvalues and eigenvectors calculated from the diffusion tensor), that it may be possible to express the eigenvalues, eigenvectors, or the lattice index itself explicitly in terms of the intensities of the DWIs. In order to provide these explicit relationships, the DWI sequences employed should result in negligible diffusion attenuation by the imaging gradients, and in negligible cross terms in the relationship between echo attenuation and applied magnetic field gradients. Accordingly, images based on the scalar invariants or on other functions of the diffusion tensor may be generated by acquiring seven DWIs and directly solving the analytic expressions for the quantities of interest. See, Basser, P. J., and Pierpaoli, C., "Analytic Expressions for the Diffusion Tensor Elements", *Proc. 5th Annual ISMRM*, Vancouver (1997).

It may be appreciated, therefore, that a feature of the present invention is that it provides an objective and quantitative measure of anisotropy which is robust in that it is insensitive to the effects of measurement noise. An attendant feature is that a lattice index according to the present invention exhibits linearity, and good dynamic range even at low SNR. Features of the present invention may be further appreciated by way of contrast with conventional averaging techniques used to reduce noise. That is, it is understood that with noisy diffusion weighted images, the variance may be reduced by locally averaging previously proposed rotationally invariant anisotropy indices over a group of voxels. Yet such averaging does not compensate for noise induced bias in the anisotropy index. It may be understood that the intervoxel lattice anisotropy index according to the present invention is more immune to bias than an intravoxel index, because the effect of noise, which makes the medium appear more anisotropic, is partially compensated for by the loss in coherence between eigenvectors as the noise level increases. It may be appreciated, therefore, that another feature of the lattice anisotropy index of the present invention is that it uses all the information contained in the diffusion tensor to reduce noise (in particular, the eigenvectors of D, which are not used explicitly in an intravoxel anisotropy index).

It is understood that a biologically significant issue, which is inherently coupled to the effects of noise on the eigenvalues (and functions thereof), is the degree of susceptibility of diffusion tensor fields, and their associated fiber-tract direction maps, to MRI noise present in diffusion weighted images (DWIs). For purposes of clarity of exposition, consider that a graphical means to display the diffusion tensor field, D(x,y,z), is to construct diffusion ellipsoid maps or images, as described above. In white matter and skeletal muscle, for example, the local fiber-tract direction corresponds to the major or polar axis of the ellipsoid, and is thus given by the principal direction (eigenvector)$\epsilon_1$(x,y,z), associated with the largest principal diffusity (eigenvalue)$\lambda_1$(x, y,z). This vector field can be displayed in various ways, e.g., as an arrow or a line drawn in each voxel or as a set of Euler angles displayed in each voxel. This vector field is also affected by noise.

More particularly, as described, MRI noise has been shown to introduce a significant bias in the assignment of the eigenvalues of D. Since each eigenvector is associated with a particular eigenvalue, the assignment or determination of the fiber-tract direction in each voxel (or of the set of Euler angles) is also biased. Moreover, since diffusion tensor MRI is intrinsically a statistical technique, D and all of the quantities computed from it are random variables. Thus, the eigenvalues and eigenvectors in each voxel are not determined precisely in a diffusion tensor MRI experiment, but are subject to variation.

It may be appreciated that according to the present invention, estimates of functions of the eigenvalues (which includes the eigenvalues themselves) are effectively improved based on the estimated eigenvectors. That is, intervoxel coherence of the diffusion tensor eigenvectors in anisotropic media is used to improve the estimate of anisotropy which intrinsically depends on the eigenvalues of the diffusion tensor. Thus, although the anisotropy index according to the present invention may be considered as being a function of both the eigenvalues and the eigenvectors of the diffusion tensor, it may also be equivalently considered as being an improved estimate of a function of the eigenvalues, since scalar measures of anisotropy are intrinsically functions of the eigenvalues not of the eigenvectors. It is understood that improved estimates of the eigenvalues may be used to improve estimates of the eigenvectors. It may also be understood by one skilled in the art that alternative representations of, or limitations on, local (e.g., intervoxel) fiber direction field coherence or order in anisotropic media may be applied to improve estimates of the eigenvalues (including functions thereof). Moreover, it is appreciated that such limitations on local fiber direction field coherence or order may be applied to first improve estimates of the eigenvectors themselves, and that the improved eigenvector estimates may be used to improve estimates of the eigenvalues. Such approaches are well suited for a variety of convergent iterative schemes for providing improved estimates of the eigenvalues and the eigenvectors.

The following examples are presented to illustrate features and characteristics of the present invention, which is not to be construed as being limited thereto.

EXAMPLE 1

In this example, the noise immunity and related low bias were assessed, verified, and compared with other rotationally invariant measures of diffusion anisotropy which do not account for orientational coherence.

In particular, Monte Carlo simulations were performed to assess the effect of noise on the various anisotropy indices estimated from the diffusion tensor. Diffusion tensors whose trace is representative of brain parenchyma (2100*$10^{-6}$ mm²/s) but with different degrees of diffusion anisotropy were generated for each of a plurality of voxels in a regular two-dimensional slice. For simplicity, it was assumed that the anisotropic tissue's principal axes coincided with the laboratory frame of reference, and that diffusion anisotropy was cylindrically symmetric. Using the same set of 25 b-matrices that were used in actual animal experiments, 25 synthetic, noise-free DWI signal intensities were generated using Eq. (1) above.

Then, thermal noise in the MRI measurement were simulated and added to the synthetic, noise-free DWI signal intensities. First, complex random numbers were generated whose real and imaginary parts were Gaussian distributed with a mean of 0 and a standard deviation scaled to the desired r.m.s. noise level. Then, the noise-free signal was added to the real part of the complex noise, and the magnitude of the resulting complex number was taken to generate a noisy amplitude DWI signal. To check the validity of this approach, it was confirmed that the standard deviation of the noisy amplitude signal equaled the selected r.m.s. noise level. See, e.g., R. M. Henkelman, "Measurement of signal intensities in the presence of noise in MR images", Med Phys 12, 232–233 (1985). For each assumed diffusion tensor, 16,384 replicates were performed.

Figure 2A:
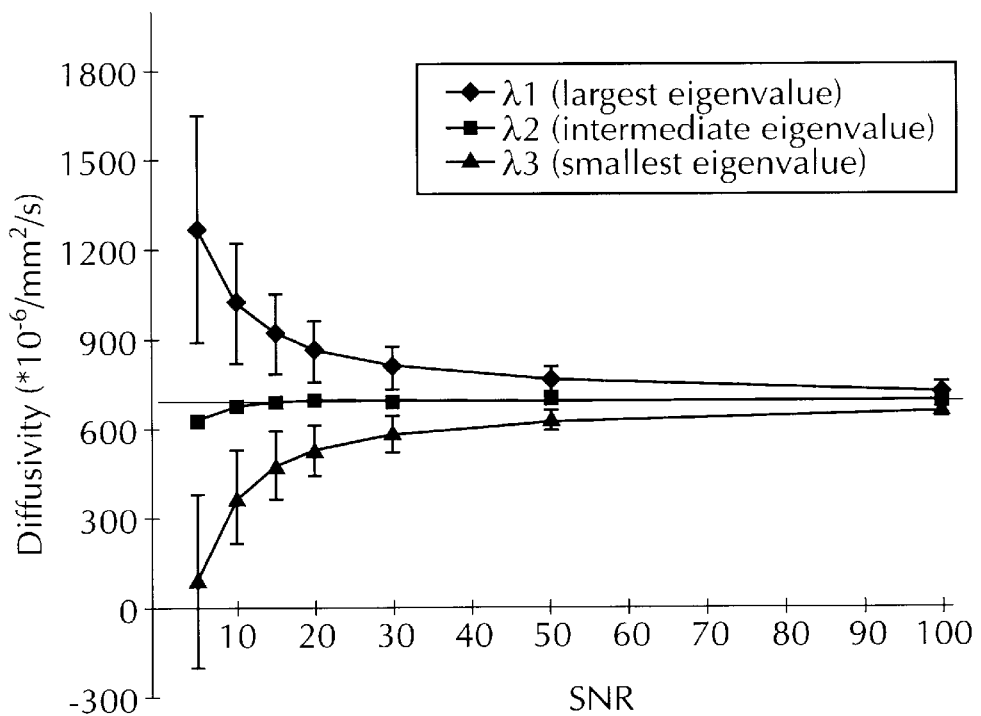
FIG. 2A illustrates the distribution of sorted principal diffusivities, $\lambda_1$, $\lambda_2$, and $\lambda_3$, generated by Monte Carlo simulations for an isotropic medium, as a function of the signal-to-noise ratio in the DWIs, thus illustrating the noise induced bias which may affect anisotropy measures.
Figure 2B:
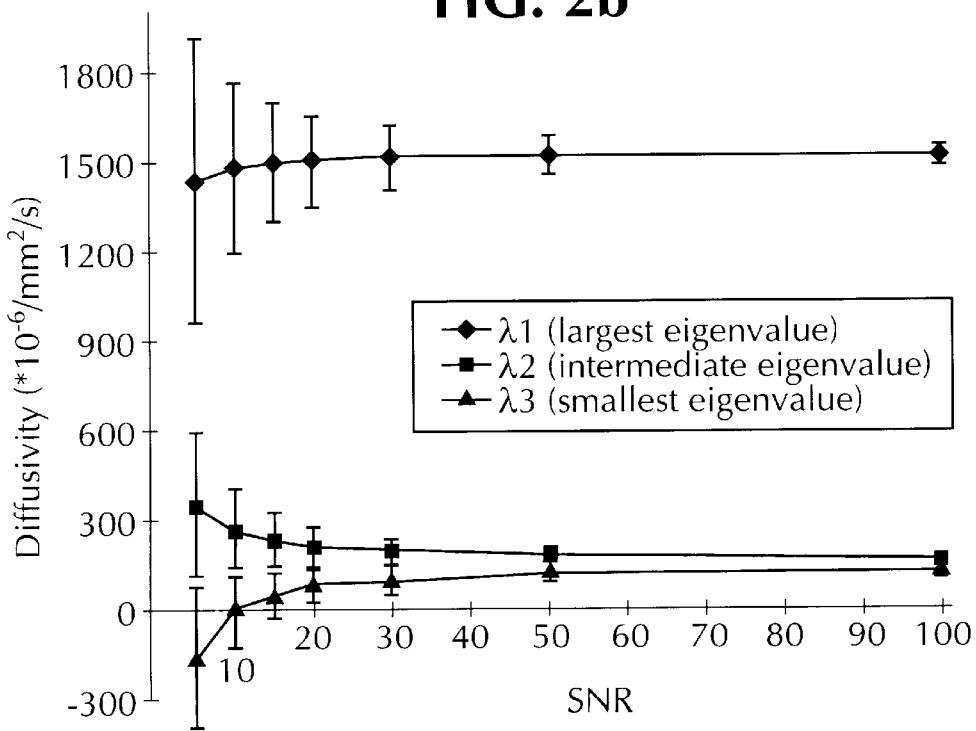
FIG. 2B illustrates the distribution of sorted principal diffusivities, $\lambda_1$, $\lambda_2$, and $\lambda_3$, generated by Monte Carlo simulations for an anisotropic medium, as a function of the signal-to-noise ratio, thus illustrating the noise induced bias which may affect anisotropy measures.

FIG. 2A and FIG. 2B show the estimated means and standard deviations of principal diffusivities, $\lambda_1$, $\lambda_2$, and $\lambda_3$, as functions of the signal-to-noise-ratio (SNR) of the non-diffusion weighted data generated from the Monte Carlo simulation for isotropic and anistropic diffusion, respectively. Data in FIG. 2A was generated assuming a diffusion tensor representative of isotropic tissue (comparable to gray matter) with asymptotic values (i.e., those with infinite SNRs) of $\lambda_1=\lambda_2=\lambda_3=700*10^{-6}$ mm²/s. For any non-zero noise level, there is a significant difference between the true and the means of the simulated values of $\lambda_1$ and $\lambda_3$. Inherently, the mean $\lambda_1$ is larger than its asymptotic value and the mean $\lambda_3$ is smaller than its asymptotic value. The bias in $\lambda_2$ is much smaller for all SNRs. An additional bias (introduced by the logarithmic transformation used to estimate diffusion tensor elements) becomes significant only when SNR drops below 10. FIG. 2A thus shows that for all SNR there is a significant difference between the mean values of $\lambda_1$, $\lambda_2$, and $\lambda_3$ in an isotropic medium, even though their true values (i.e., their asymptotic noise-free values) are all equal.

FIG. 2B shows results from the Monte Carlo simulation assuming cylindrically symmetric anisotropic tissue with principal diffusivities comparable to those of a highly anisotropic white matter tract ($\lambda_1=1500*10^{-6}$ mm²/s, $\lambda_2=\lambda_3=200*10^{-6}$ mm²/s). In this case, the mean $\lambda_2$ is systematically larger than its asymptotic value, and the mean $\lambda_3$ is smaller than its asymptotic value. For very low SNR levels, negative values of the mean of $\lambda_3$ can be observed. While this is physically impossible, the eigenvalues of D may not explicitly be constrained to be positive when they are estimated. $\lambda_1$ is relatively unbiased for all SNRs in white-matter like tissue.

Figure 3A:
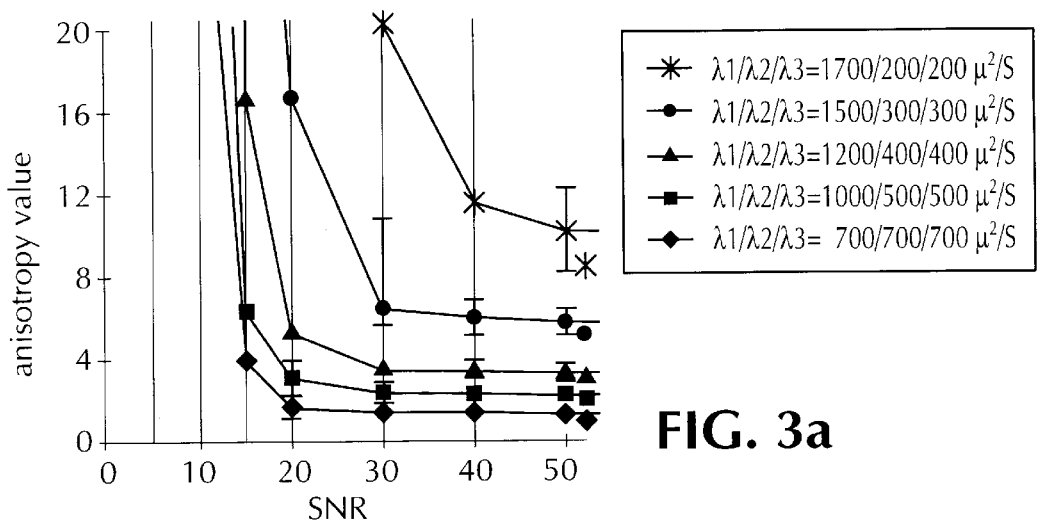
FIG. 3A shows simulated values of rotationally invariant anisotropy ratio index $\lambda_1/\lambda_3$ as a function of the signal-to-noise ratio.
Figure 3B:
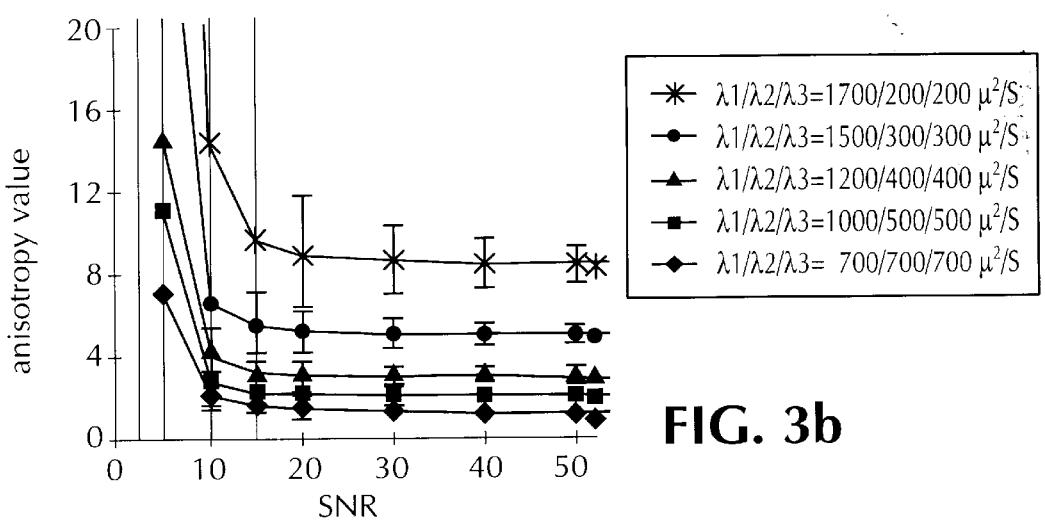
FIG. 3B shows simulated values of rotationally invariant anisotropy ratio index $\lambda_1/(\lambda_2+\lambda_3)/2$ as a function of the signal-to-noise ratio.

FIGS. 3A–3E show the SNR dependence of different invariant anisotropy indices constructed from the Monte Carlo simulated data for levels of anisotropy in the range of those observed in brain tissue. Two invariant anisotropy ratios which require sorting the eigenvalues according to their magnitude are shown in FIG. 3A and FIG. 3B. This ordering of biased eigenvalues introduces a systematic bias in these ratios. The systematic bias, while individually making $\lambda_1$ larger and $\lambda_3$ smaller than their true values, causes their ratio, $\lambda_1/\lambda_3$, to be significantly larger than its true value at all noise levels (FIG. 3A). In addition, the variance of this ratio is significantly larger in anisotropic media than in isotropic media. In FIG. 3B, which shows the invariant anisotropy ratio $\lambda_1/(\lambda_2+\lambda_3)$, it can be seen that the bias is much less pronounced than in FIG. 3A, particularly for high values of anisotropy, and that the predictions are more reliable over a larger range of SNRs. For isotropic media, the value of $\lambda_1/(\lambda_2+\lambda_3)/2$ is still significantly different from the true value of 1, because $\lambda_1$ and $\lambda_2$ are still occasionally misclassified.

One approach to remove the systematic bias introduced by sorting the eigenvalues is to use a rotationally invariant anisotropy index that is insensitive to their order. The Volume Ratio (FIG. 3C), and the Fractional Anisotropy (FIG. 3D), are two intravoxel anisotropy indices that are insensitive to sorting of the eigenvalues. See, C. Pierpaoli, J. Mattiello, D. Le Bihan, G. Di Chiro, P. J. Basser, "Diffusion tensor imaging of brain white matter anisotropy", Proceedings of the Society of Magnetic Resonance, 2nd Meeting, San Francisco, 1994, p. 1038; and P. Basser, C. Pierpaoli, "Elucidating Tissue Structure by Diffusion Tensor MRI", SMR/ESMRMB, Nice, France, 1995, p. 900, which are herein incorporated by reference.

The Fractional Anisotropy index for a voxel is defined by:

$$FA = \frac{3}{2}\frac{\sqrt{\tilde{D}:\tilde{D}}}{\sqrt{D:D}} \tag{8}$$

which represents the "magnitude" (square root) of the tensor dot product of the deviatoric with itself (i.e., $(\tilde{D}:\tilde{D})^{1/2}$), normalized by the "magnitude" (square root) of tensor dot product of the diffusion tensor with itself (i.e., $(D:D)^{1/2}$). The Volume Ratio is defined by:

$$VolumeRatio = \frac{\lambda_1\lambda_2\lambda_3}{\left(\frac{\lambda_1+\lambda_2+\lambda_3}{3}\right)^3} = 27\frac{Det(D)}{Tr(D)^3} \tag{9}$$

where Det(D) is the determinant of D. The Volume Ratio has a simple geometrical interpretation: it represents the volume of an ellipsoid whose semi-major axes are the three eigenvalues of the diffusion tensor, D, divided by the volume of a sphere whose radius is the mean diffusively, Tr(D)/3. Since the volume of the ellipsoid approaches 0 as anisotropy increases, the values of the Volume Ratio range between 0 and 1, where 0 indicates the highest anisotropy and 1 represents complete isotropy. The right hand side of the equation shows that this index is the ratio of two scalar invariant quantities computed from the diffusion tensor, its Determinant and its Trace, thus assuring rotational invariance.

Figure 3C:
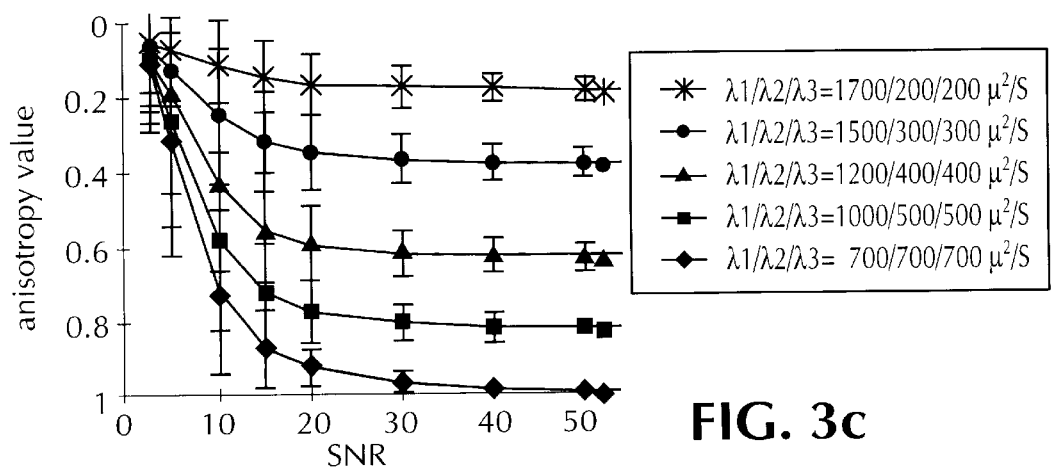
FIG. 3C shows simulated values of the rotationally invariant Volume Ratio index as a function of the signal-to-noise ratio.
Figure 3D:
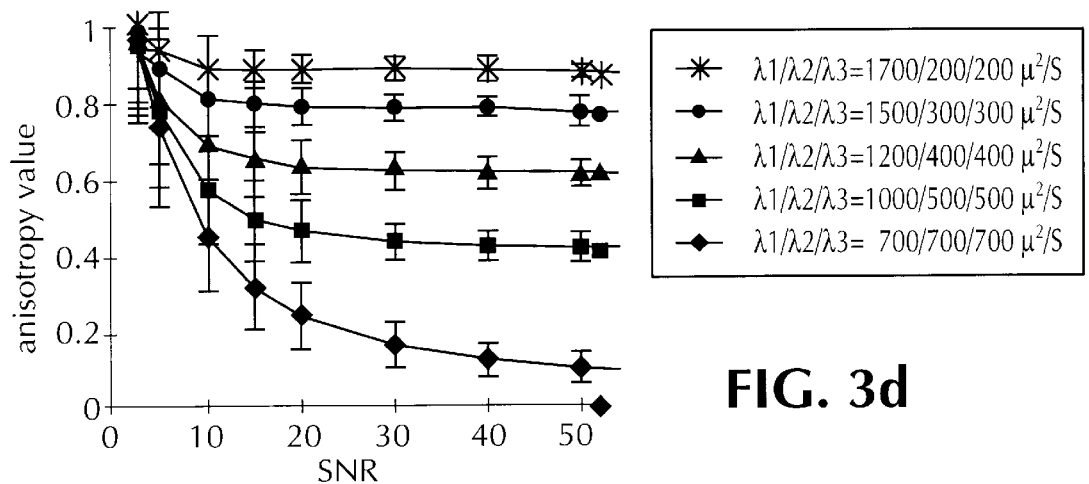
FIG. 3D shows simulated values of the rotationally invariant Fractional Anisotropy index as a function of the signal-to-noise ratio.

It can be seen in FIG. 3C and FIG. 3D that these eigenvalue order independent, rotationally invariant anisotropy indices exhibit a lower variance at all SNRs than the anisotropy ratios of FIG. 3A and FIG. 3B. Moreover, this variance is less sensitive to differences in anisotropy among tissues. Yet they exhibit a significant bias, resulting in a progressive increase in apparent anisotropy, as SNR decreases. Further, at all SNRs both indices are still slightly biased, making all media appear more anisotropic than they are (although this artifact is no longer caused by sorting). The utility of these anisotropy measures lies in the fact that over the range of SNRs encountered in clinical diffusion imaging studies, their variances are still acceptably small, and relatively insensitive to the degree of anisotropy. For all values of SNR, both of these anisotropy indices are superior to $\lambda_1/\lambda_3$, but they still suffer from bias.

Figure 3E:
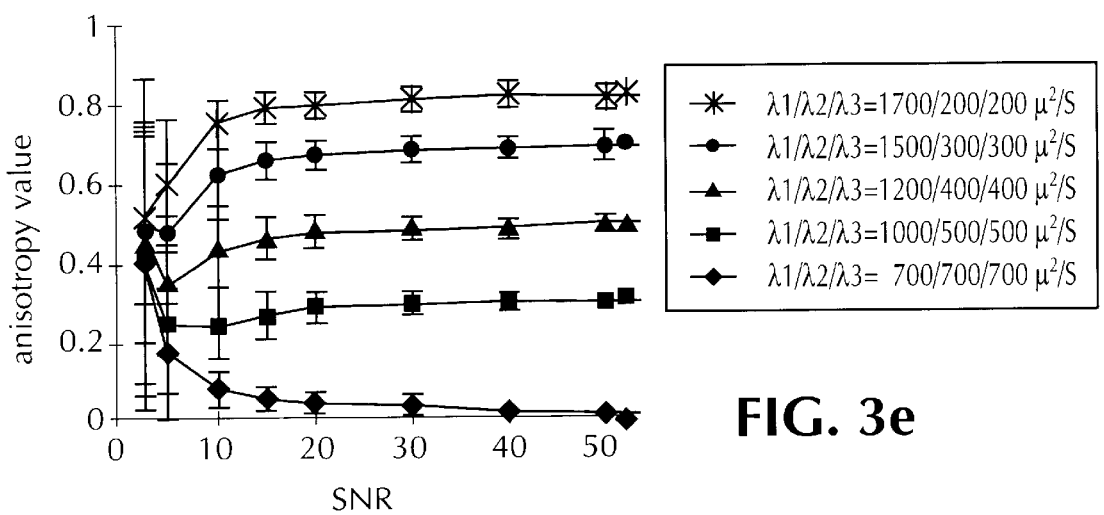
FIG. 3E shows simulated values of a rotationally invariant Lattice Anisotropy index, according to an embodiment of the present invention, as a function of the signal-to-noise ratio.

FIG. 3E shows the results for the lattice anisotropy index ("lattice index") calculated according to the embodiment of the present invention represented by equations (6) and (7). It can be seen that the lattice index shows the lowest bias and variance compared with the anisotropy indices shown in FIGS. 3A–3D. Moreover, it can be seen that the lattice anisotropy index demonstrates, over a wide range of SNR, good linearity and dynamic range of the anisotropy value as a function of actual anisotropy. In particular, at low SNR the linearity and dynamic range characteristics of the lattice index are clearly superior to those of the anisotropy indices shown in FIGS. 3A–3E, due in part to the immunity to noise-induced bias.

EXAMPLE 2

As described above, both the eigenvalues and eigenvectors of the diffusion tensor are subject to uncertainty (e.g., variation and bias), which is further illustrated by the following example.

In diffusion tensor imaging, we estimate a mean and variance of each component of the effective diffusion tensor, D, which is therefore not a deterministic quantity. Since the components of the diffusion tensor are random variables, so are functions of them, such as their eigenvalues and eigenvectors. Therefore, the fiber direction field (vector field), as well as anisotropy indexes, and the similarity measures defined above are random variables. It is particularly useful to calculate the first and second moments of the eigenvalues and eigenvectors as well as functions of them, such as the correlation function.

In previous studies (See, e.g., Basser, P. J., J. Mattiello, and D. LeBihan, "Estimation of the effective self-diffusion tensor from the NMR spin echo", *J Magn Reson B*. 103:247–54, 1994), the standard error matrix, $M^{1/2}$, was calculated when D was estimated, paying special attention to determining accurately the experimental error variance in the multivariate linear regression. Although the relative error of each component of D in these in vitro experiments was less than 1%, in clinical studies, where background noise is higher, there is more uncertainty in maps of fiber orientation and in estimates of mean diffusion distances using diffusion NMR spectroscopy or imaging. The success of these methods depends upon whether the fractional errors in the eigenvalues and angular deviations in the eigenvectors of the estimated D are small. In the present example, this problem was studied in two ways. First, deterministic rules were used to derive the fractional errors in the eigenvectors and eigenvalues of the estimated D. Although a formal analysis would require determining the moments of the Wishart distribution (See, e.g., Fukunaga, K., "Introduction to statistical pattern recognition", In *Electrical Sciences*, H. G. Booker, and N. DeClaris, Fukunaga, K. S. Academic Press, Inc., N.Y. 1972), if the standard errors of D are small enough, this approximate method can be used. In addition, a probabilistic Monte Carlo method was used to synthesize a family of eigenvalues and eigenvectors from which the variances in the eigenvalues and eigenvectors were estimated, and diffusion ellipsoids were constructed.

First-order perturbation analysis (Fukunaga, 1972) provides an approximate method to determine the errors made in estimating the eigenvectors and eigenvalues of D, as well as the scalar invariants, when the uncertainty in the diffusion tensor components are within a few percent of their mean values. If $\Delta D$ is the symmetric matrix containing the standard errors of each component of D, and the corresponding uncertainties in $\lambda_j$ and E are represented by $\Delta\lambda_j$, and $\Delta E$, respectively, then:

$$\Delta\lambda_j \approx \epsilon_j^T \Delta D \epsilon_j \quad (10)$$

$$\Delta E \simeq ER \text{ where } R_{ij} = \begin{cases} \dfrac{\epsilon_i^T \Delta D \epsilon_j}{\lambda_i - \lambda_j} & \text{for } i \neq j \\ 0 & \text{for } i = j \end{cases} \quad (11)$$

The subtended angle, $\Delta\theta_i$, between the $i^{th}$ perturbed eigenvector of D, $\epsilon_i + \Delta\epsilon_i$, and the estimated eigenvector $\epsilon_i$, measures the angular deviation of the fiber direction:

$$\Delta\theta_i = \tan^{-1}\left(\frac{|\Delta\epsilon_i|}{|\epsilon_i|}\right) = \tan^{-1}(|\Delta\epsilon_i|) \quad (12)$$

with $$s_i = \sqrt{\langle \Delta\theta_i^2 \rangle - \langle \Delta\theta_i \rangle^2} \quad (13)$$

In addition, Monte Carlo simulations were performed in which each component of D was treated as a random variable. The random tensor, $D_{MC}$, was synthesized from a Gaussian normal distribution, the variance of which was taken to be the measurement error variance (the diagonal elements of $M^{-1}$), and the mean of which was the estimated diffusion tensor. Eigenvalues and eigenvectors were calculated for each $D_{MC}$.

Figure 4:
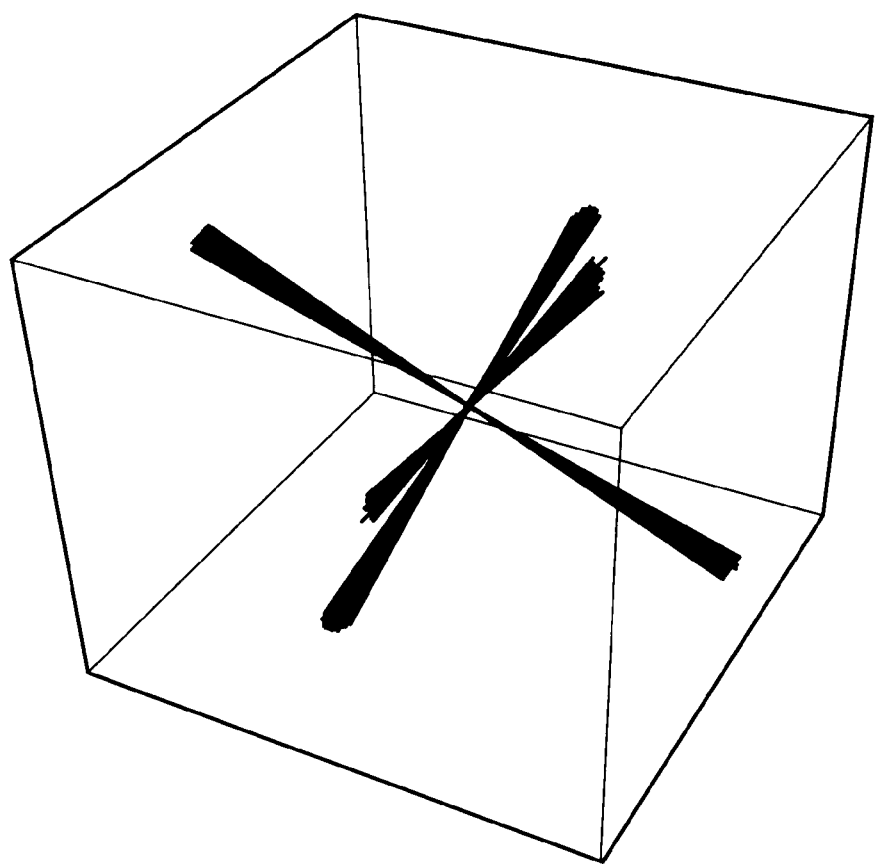
FIG. 4 shows the distribution of the three orthogonal eigenvectors of the effective diffusion tensor, each eigenvector weighted by the square root of the corresponding eigenvalue, as determined by a Monte Carlo simulation.

FIG. 4 shows the distribution of the principal coordinate axes and three principal diffusion distances for 100 eigenvectors. Each is centered in the voxel, weighted by the square root of its corresponding eigenvalues using $D_{MC}$ for pork loin. FIG. 4 is instructive because it shows the effect of simultaneous variations in the eigenvectors and eigenvalues of D. The weighted eigenvectors are displayed such that the endpoints of each line segment lie on the diffusion ellipsoid, and thus these axes represent the major and minor axes of the diffusion ellipsoid. While the principal axes do not precisely superimpose, and the ellipsoid's major axes are not all identical, the scatter is small enough to be able to determine both fiber orientation and the principal diffusion coefficients satisfactorily.

Thus, as illustrated through the preferred embodiment and the foregoing examples, and as understood by further practicing the present invention, many advantages and attendant advantages are provided by the present invention, which provides a quantitative and objective measure of anisotropy which is immune to noise induced bias effects. In practice, this quantitative anisotropy measure reduces artifacts which would erroneously indicate higher degrees of anisotropy than actually exist, and would result not only in anisotropic tissue appearing more anisotropic but also in isotropic tissue appearing anisotropic, thus obfuscating differentiation of anisotropic tissue from isotropic tissue. Further, it may be appreciated, therefore, that the lattice index which accounts for intervoxel orientational coherence to mitigate noise-induced bias according to the present invention provides an improved diagnositic modality, and enhances the robustness and reliability of diffusion tensor anisotropy images for identifying and characterizing pathology. Finally, it is noted that one skilled in the art appreciates that the method of the present invention is not limited to diffusion tensor MRI measurements but may be also applied to other measurement techniques which may be adapted to image the diffusion tensor, such as, for example, electron spin resonance (ESR) techniques.

Although the above description provides many specificities, these enabling details should not be construed as limiting the scope of the invention, and it will be readily understood by those persons skilled in the art that the present invention is susceptible to many modifications, adaptations, and equivalent implementations without departing from this scope and without diminishing its attendant advantages. It is therefore intended that the present invention is not limited to the disclosed embodiments but should be defined in accordance with the claims which follow.

We claim:

1. A method for assessing diffusion anisotropy in an object that was subjected to resonance imaging, said method comprising the computer executed steps of: obtaining information signals resulting from the resonance imaging, said information signals sufficient for representing, for each of a plurality of localized regions in said object, at least one rotationally invariant principal direction and at least two rotationally invariant diffusivities along respective rotationally invariant principal directions of spin-labeled species displacements in said object; and generating for at least one localized region a rotationally invariant lattice index signal from said information signals according to a function representing orientational coherence between at least one rotationally invariant principal direction of diffusion in a first one of said plurality of localized regions and at least one rotationally invariant principal direction of diffusion in another localized region such that said rotationally invariant lattice index signal has reduced bias and/or reduced variance from noise.

2. The method according to claim 1, wherein said information signals correspond to diffusion weighted image signals acquired by magnetic resonance imaging of said object.

3. The method according to claim 1, further comprising the step of generating an image having a plurality of pixels corresponding to said localized regions, with a visual characteristic of each pixel assigned according to the rotationally invariant lattice index signal for the respective localized regions.

4. The method according to claim 3, wherein said visual characteristic is color, gray-scale value, or intensity.

5. The method according to claim 4, wherein said lattice index signal is represented as:

$$LI_N = \frac{\sqrt{3}}{\sqrt{8}} \frac{\sqrt{\tilde{D}_{ref} : \tilde{D}_N}}{\sqrt{D_{ref} : D_N}} + \frac{3}{4} \frac{\tilde{D}_{ref} : \tilde{D}_N}{\sqrt{D_{ref} : D_{ref}} \sqrt{D_N : D_N}}$$

where $D_{ref}$ and $\tilde{D}_{ref}$ are the diffusion tensor and its deviatoric in a reference voxel, respectively, and $D_N$ and $\tilde{D}_N$ are the diffusion tensor and its deviatoric in an arbitrary (neighboring) voxel, respectively.

6. The method according to claim 5, wherein said step of determining the diffusion tensor for each localized region is executed according to statistical estimation.

7. The method according to claim 5, wherein said step of determining the diffusion tensor for each localized region is executed according to analytic expression of the diffusion tensor elements with respect to the diffusion weighted image signals.

8. The method according to claim 1, wherein said function includes a tensor dot product between the anisotropic parts of respective diffusion tensors representing rotationally invariant principal directions and rotationally invariant diffusivities along rotationally invariant principal directions of spin-labeled species displacements for the first and another localized regions.

9. The method according to claim 1, wherein said obtaining step includes obtaining said diffusion weighted image signals, and wherein said generating step includes determining from said diffusion weighted image signals a representation of a diffusion tensor for each localized region, each diffusion tensor representing rotationally invariant principal directions and rotationally invariant diffusivities along rotationally invariant principal directions of spin-labeled species displacements.

10. The method according to claim 1, wherein said obtaining step includes the step of obtaining said information signals as diffusion tensors for each of said localized regions, each of the diffusion tensors representing rotationally invariant principal directions and rotationally invariant diffusivities along rotationally invariant principal directions of spin-labeled species displacements.

11. The method according to claim 1, wherein said obtaining step includes the step of obtaining said information signals as eigenvalues and eigenvectors for each of said localized regions, the eigenvectors representing rotationally invariant principal directions of spin-labelled species displacements, and the eigenvalues representing diffusivities along rotationally invariant principal directions of spin-labeled species displacements.

12. The method according to claim 1, further comprising the pre-processing executed step of assessing the amount of bias sensitivity of said function according to Monte Carlo simulation.

13. The method according to claim 1, wherein said rotationally invariant lattice index signal is averaged over adjacent pixels.

14. The method according to claim 13, wherein said average weights the adjacent pixels according to their distance.

15. The method according to claim 14, wherein said histological or physiological paramater is based on T2, T1, or trace of a diffusion tensor tensor representing rotationally invariant principal directions and rotationally invariant diffusivities along rotationally invariant principal directions of spin-labeled species displacements.

16. The method according to claim 1 further comprising the step of identifying a histological or physiological parameter for each localized region from magnetic resonance imaging information, and wherein said rotationally invariant lattice index signal is only formed between said first local region and said another region only if the first local and another region have similar histological parameters.

17. The method according to claim 1, wherein said rotationally invariant lattice index signal has reduced bias from noise.

18. A method for assessing diffusion anisotropy in an object that was subjected to resonance imaging, said method comprising the computer executed steps of:

obtaining information signals resulting from the resonance imaging, said information signals sufficient for representing at least one eigenvalue of a diffusion tensor for each of a plurality of localized regions in said object, each of the at least one eigenvalue representing diffusively of spin-labelled species displacement in the object along a corresponding rotationally invariant principal direction of spin-labeled species displacement; and generating for at least one localized region an improved estimate of a function of the at least one eigenvalue of the diffusion tensor, based on said information signals and on a representation of local structural direction field coherence or order in the object.

19. The method according to claim 18, wherein said local structural direction field coherence or order in the object is represented by the orientational coherence between at least one rotationally invariant principal direction of diffusion of the spin-labeled species in the localized region and at least one principal direction of diffusion of the spin-labeled species in another localized region such that said function of at least one eigenvalue has reduced bias and/or reduced variance from noise.

20. The method according to claim 19, wherein said function of at least one eigenvalue includes a tensor dot product between the anisotropic parts of the respective diffusion tensors for the localized region and the another localized region.

21. The method according to claim 18, wherein said function of at least one eigenvalue is equal to one of said at least one eigenvalue.

22. The method according to claim 18, wherein said function of at least one eigenvalue is equal to a lattice index signal represented as:

$$LI_N = \frac{\sqrt{3}}{\sqrt{8}} \frac{\sqrt{\tilde{D}_{ref} : \tilde{D}_N}}{\sqrt{D_{ref} : D_N}} + \frac{3}{4} \frac{\tilde{D}_{ref} : \tilde{D}_N}{\sqrt{D_{ref} : D_{ref}} \sqrt{D_N : D_N}}$$

where $D_{ref}$ and $\tilde{D}_{ref}$ are the diffusion tensor and its deviatoric in a reference voxel, respectively, and $D_N$ and $\tilde{D}_N$ are the diffusion tensor and its deviatoric in an arbitrary (neighboring) voxel, respectively.

23. The method according to claim 18, wherein said information signals correspond to diffusion weighted image signals acquired by magnetic resonance imaging of said object.

24. The method according to claim 18, wherein said function of at least one eigenvalue has reduced bias from noise.

25. A computer program embodied on a computer-readable medium, the computer program used for assessing diffusion anisotropy for displacements of spin-labeled species in an object that was subject to resonance imaging, the computer program comprising:

a code segment to obtain information signals resulting from the resonance imaging, the information signals sufficient for representing at least one eigenvalue of a diffusion tensor for each of a plurality of localized regions in said object, each of the at least one eigenvalue representing diffusively of spin-labelled species displacement in the object along a corresponding rotationally invariant principal direction of spin-labeled species displacement; and a code segment that generates for at least one localized region an improved estimate of a function of the at least one eigenvalue of the diffusion tensor, based on said information signals and on a representation of local structural direction field coherence or order in the object.

26. The computer program embodied on a computer readable medium according to claim 25, wherein said local structural direction field coherence or order in the object is represented by the orientational coherence between at least one rotationally invariant principal direction of diffusion of the spin-labeled species in the localized region and at least one principal direction of diffusion of the spin-labeled species in another localized region such that said function of at least one eigenvalue has reduced bias and/or reduced variance from noise.

* * * * *